United States Patent
Cabler et al.

(10) Patent No.: US 10,445,699 B2
(45) Date of Patent: Oct. 15, 2019

(54) SOCIAL ELECTRONIC DESIGN AUTOMATION

(71) Applicant: Mentor Graphics Corporation, Wilsonville, OR (US)

(72) Inventors: Adam Cabler, Tigard, OR (US); Darrell A. Teegarden, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 837 days.

(21) Appl. No.: 14/168,834

(22) Filed: Jan. 30, 2014

(65) Prior Publication Data
US 2015/0213407 A1 Jul. 30, 2015

(51) Int. Cl.
*G06Q 10/10* (2012.01)
*G06Q 50/00* (2012.01)
*G06F 17/50* (2006.01)

(52) U.S. Cl.
CPC ....... *G06Q 10/101* (2013.01); *G06F 17/5009* (2013.01); *G06F 17/5045* (2013.01); *G06F 17/5068* (2013.01); *G06Q 50/01* (2013.01)

(58) Field of Classification Search
CPC ............ G06F 17/5036; G06F 17/5045; G06F 17/5009
USPC ................................................ 705/7.29, 300
See application file for complete search history.

(56) References Cited

U.S. PATENT DOCUMENTS

| | | | | |
|---|---|---|---|---|
| 5,539,652 A * | 7/1996 | Tegethoff | ........... | G01R 31/2846 700/108 |
| 6,917,909 B1 * | 7/2005 | Markov | .............. | G06F 17/5045 703/1 |
| 7,546,571 B2 * | 6/2009 | Mankin | ............... | G06F 17/5045 700/103 |
| 8,464,161 B2 * | 6/2013 | Giles | ..................... | G06F 21/604 345/419 |
| 8,769,455 B1 * | 7/2014 | Singh | ..................... | G06F 17/505 716/101 |
| 9,317,640 B2 * | 4/2016 | Belville | .............. | G06F 17/5045 |
| 2002/0144212 A1 * | 10/2002 | Lev | ..................... | G06F 17/5045 716/102 |
| 2002/0156757 A1 * | 10/2002 | Brown | ................... | G06Q 10/06 |
| 2003/0093763 A1 * | 5/2003 | McConaghy | ......... | G06F 17/505 716/102 |
| 2004/0221179 A1 * | 11/2004 | Seshadri | ................ | G06F 21/31 726/15 |

(Continued)

OTHER PUBLICATIONS

DeOrio, Andrew and Valeria Bertacco. Electronic Design Automation for Social Networks. DAC'10, Jul. 13-18, 2010.*

*Primary Examiner* — Johnna R Loftis
(74) *Attorney, Agent, or Firm* — Mentor Graphics Corporation

(57) ABSTRACT

This application discloses web or cloud-based electronic design automation tools, which can incorporate functionality to enable collaborative and/or social interaction among multiple different users of the electronic design automation tools. The electronic design automation tools can monitor activity of a user on a design tool, compare the activity of the user on the design tool to previous design activities of one or more different users of the design tool, and prompt presentation of a design suggestion to the user based, at least in part, on a commonality between the activity of the user and previous design activities of the one or more different users.

20 Claims, 9 Drawing Sheets

(56) References Cited

U.S. PATENT DOCUMENTS

| | | | |
|---|---|---|---|
| 2007/0250800 A1* | 10/2007 | Keswick | G06F 17/5045 |
| | | | 716/102 |
| 2008/0163148 A1* | 7/2008 | Scheffer | G06F 17/5009 |
| | | | 716/51 |
| 2009/0287635 A1* | 11/2009 | Belville | G06F 17/5045 |
| 2011/0016444 A1* | 1/2011 | Paris | G06F 17/5081 |
| | | | 716/111 |
| 2012/0023472 A1* | 1/2012 | Fischer | G06F 17/5068 |
| | | | 716/122 |

* cited by examiner

SOCIAL ELECTRONIC DESIGN AUTOMATION

TECHNICAL FIELD

This application is generally related to electronic design automation and, more specifically, to adapting an electronic design environment based on collaborative user information.

BACKGROUND

Electronic design automation tools can allow users to design and analyze electronic devices or systems prior to their manufacture. While some electronic design automation tools can be very powerful, the effectiveness of these electronic design automation tools often relies on tool usability and engineering knowledge of the designer. For example, when functionality of an electronic design automation tool is difficult to invoke or realize, many designers can be stifled during the development process, often leading them to spend many hours becoming accustom to the idiosyncrasies of the particular tool or to switch to a different tool altogether.

Even when an electronic design automation tool is easy to use, some aspects of electronic design rely on user engineering knowledge, such as determining how to build certain portions of their design, selecting design components and their associated parameters, interconnecting different portions of their design, or the like. This reliance on user engineering knowledge in the design process is exacerbated when developing electronic devices with components from multiple different engineering disciplines, for example, electronic devices that include a combination of analog and digital hardware components, embedded software code, electro-mechanical components, such as sensors and actuators, or the like. While an expert in all of these disciplines would no doubt be able to effectively design a multi-discipline electronic device, other users may have problems with specific areas of their designs for which they do not have a particular engineering expertise. In other words, the tradeoff for having a more thorough and powerful multi-discipline electronic design automation tool often comes at the cost of requiring a higher level of engineering acumen from its users in order to fully utilize its functionality. This often creates a headwind, slowing tool adoption and utilization, in favor of simpler, less precise tools.

SUMMARY

This application discloses tools and mechanisms for collaborative and interactive electronic design automation (EDA), for example, utilizing web-based or cloud-based electronic design automation tools. In some embodiments, a multi-discipline design and analysis tool can aid users in developing circuit designs in a traditional sense, while also providing various design suggestions based, at least in part, on crowd-sourced information from one or more additional users. The multi-discipline design and analysis tool can monitor activity of a user on a design tool, compare the activity of the user on the design tool to previous design activities of one or more different users of the design tool, and prompt presentation of a design suggestion to the user based, at least in part, on a commonality between the activity of the user and previous design activities of the one or more different users. The multi-discipline design and analysis tool can collect registration information from the user, which not only can authorize the user to access the multi-discipline design and analysis tool, but also be utilized, for example, in combination with the activity of the user on the design tool, to identify collaboration suggestions for the user, such as other users to follow, groups to join, user designs to follow, or the like. The multi-discipline design and analysis tool can prompt presentation of the collaboration suggestions to the user, which can allow the user to interact with different users of the multi-discipline design and analysis tool, for example, in forums corresponding to user groups, individual users, individual designs, or the like.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
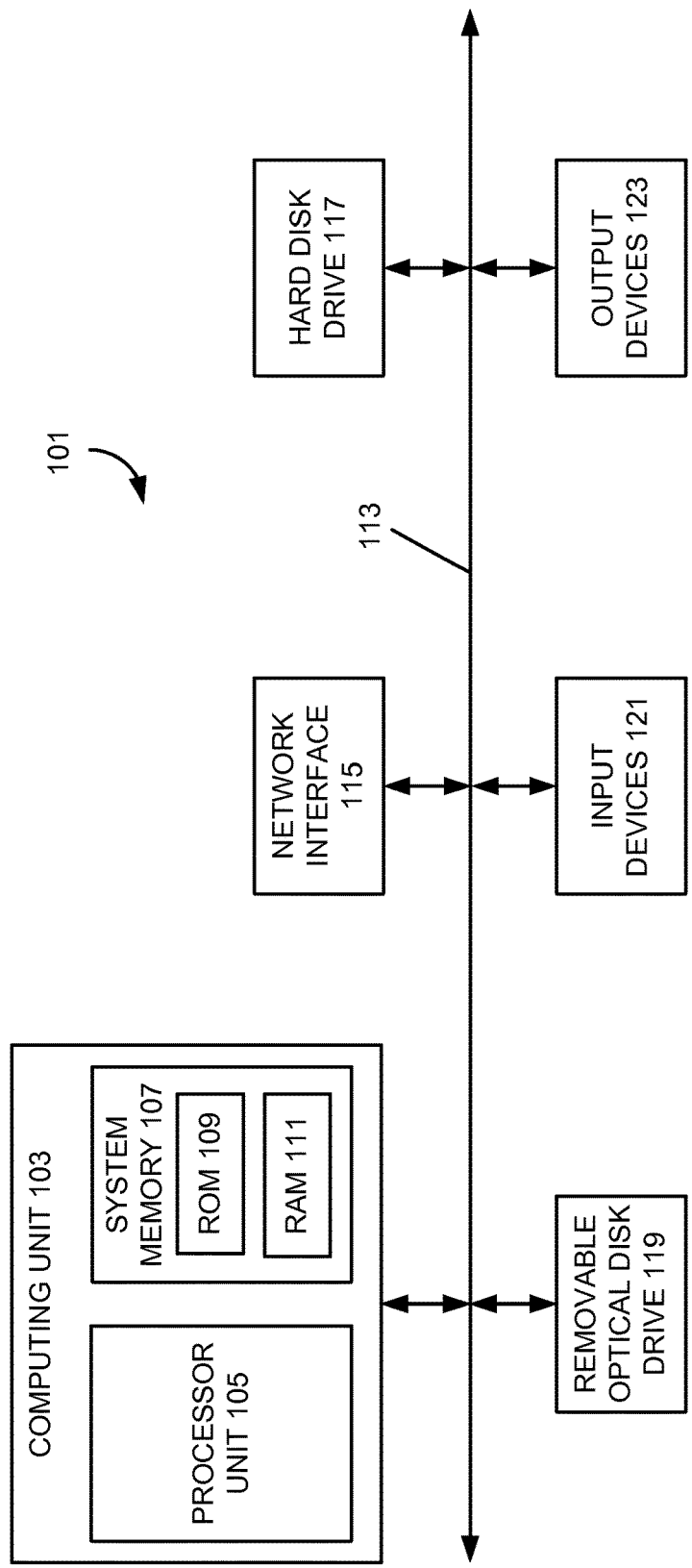
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
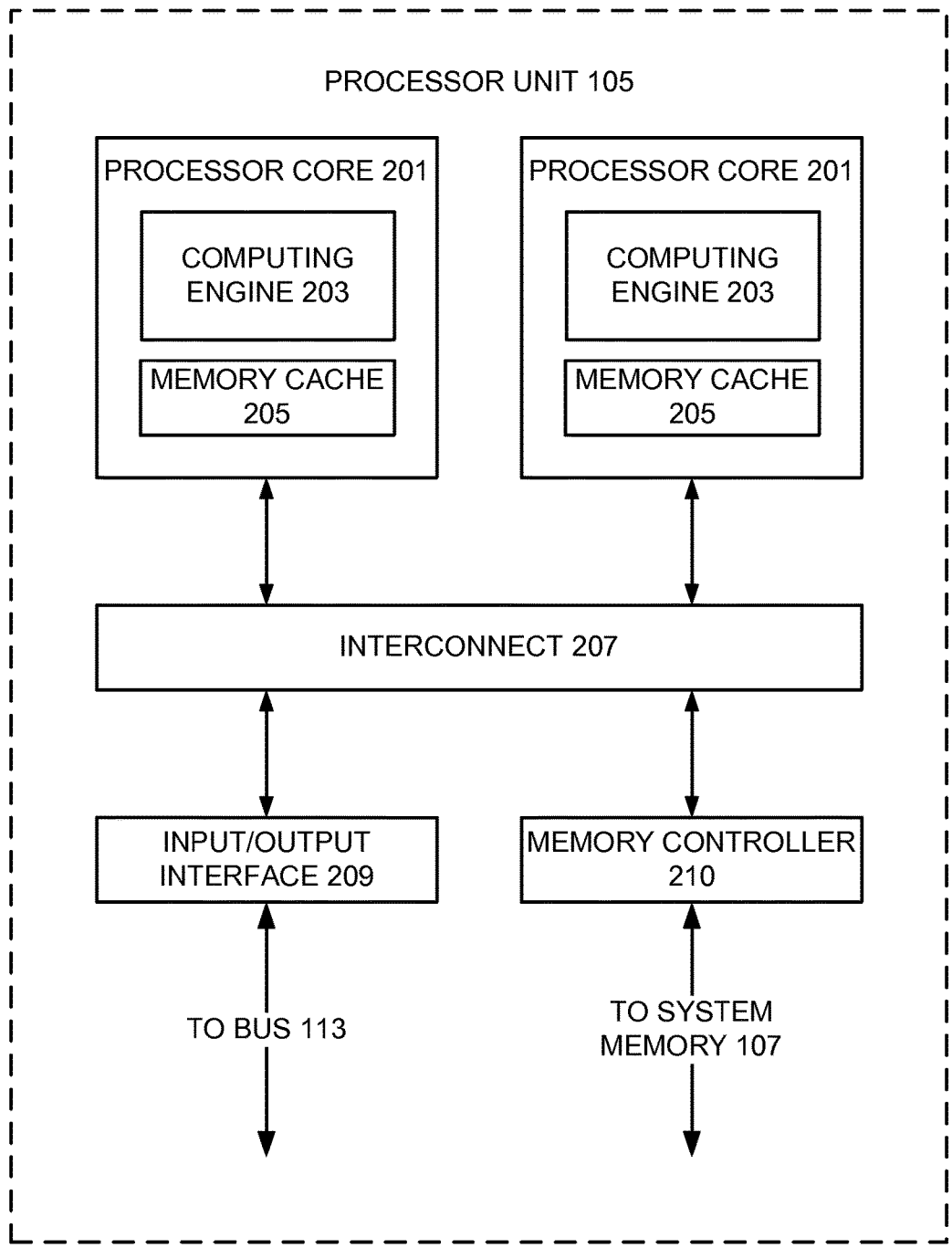

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Cloud-Based Electronic Design Automation

Figure 3:
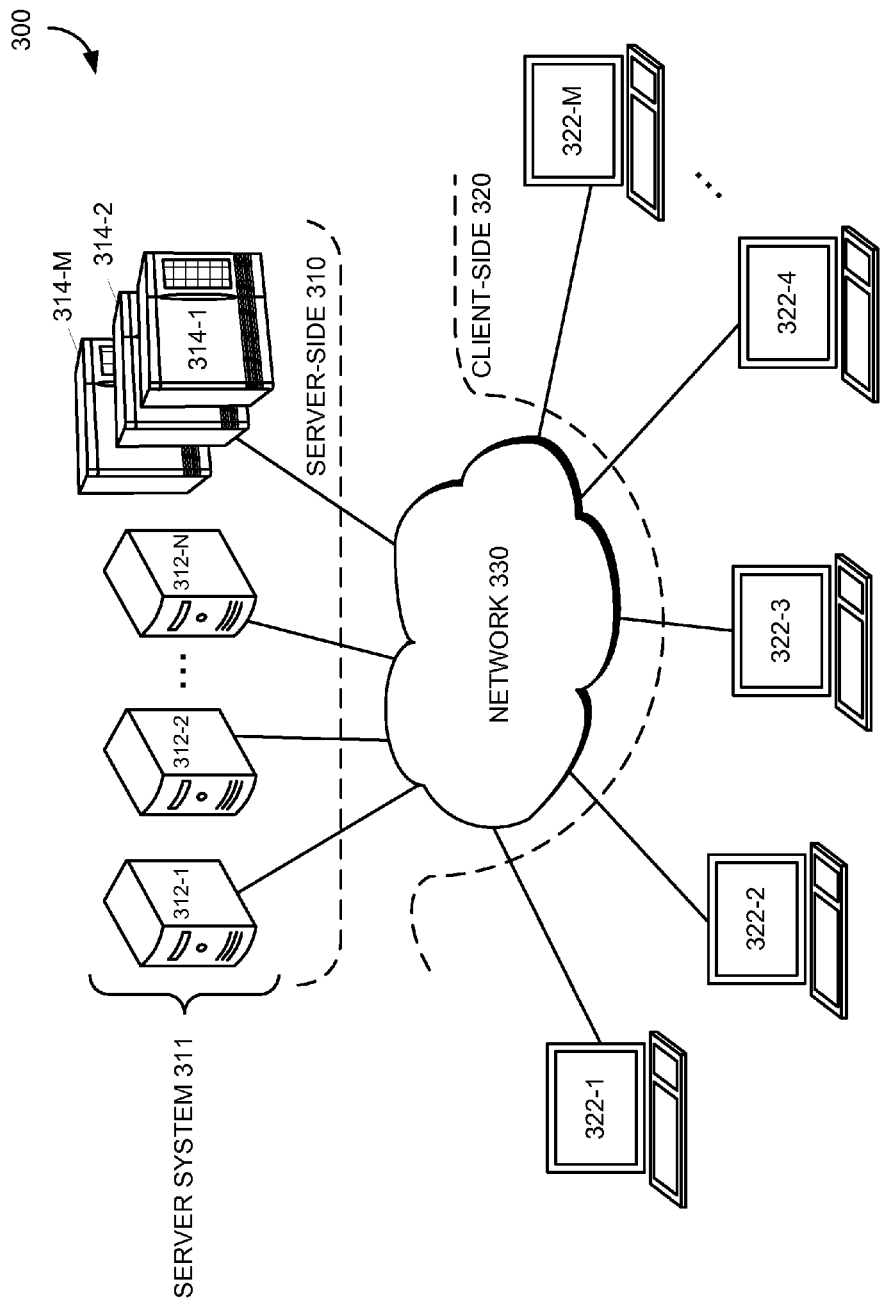
FIG. 3 illustrates an example system including a server system implementing a collaborative electronic design automation environment with a distributed group of client devices over a network according to various embodiments of the invention.

FIG. 3 illustrates an example system 300 including a server system 311 implementing a collaborative electronic design automation environment with a distributed group of client devices 322-1 to 322-M over a network 330 according to various embodiments of the invention. Referring to FIG. 3, the system 300 includes a server-side 310 and a client-side 320, which can communicate with each other over the network 330. The server-side 310 can include the server system 311 to implement a collaborative electronic design environment for various client devices 322-1 to 322-M in the client-side 320 of the system 300. To realize the collaborative electronic design environment, the server system 311 can allow the client devices 322-1 to 322-M remote access to at least one electronic design automation tool implemented by the server system 311, and adapt the experience client devices 322-1 to 322-M with the electronic design automation tool based on the information from the user, user activity on the electronic design automation tool, activity of other users of the electronic design automation tool, or the like. Embodiments of the collaborative electronic design environment will be described below in greater detail.

In some embodiments, the server system 311 can include multiple servers 312-1 to 312-N or other processing devices capable of implementing the collaborative electronic design automation environment for various client devices 322-1 to 322-M. In some embodiments, the server system 311 can include one or more emulation devices 314-1 to 314-M to provide scalable verification for circuit designs, for example, simulating the circuit designs with scalable and reconfigurable hardware, in the collaborative electronic design environment. The client devices 322-1 to 322-M can be computers, laptops, workstations, tablets, handsets, or other processing devices capable of communicating with the server system 311 over the network 330. The network 330 can include one or more packet-switched networks, one or more circuit-switched networks, a combination of both, or the like, which can exchange communication between the server-side 310 and the client-side 320 over wired, wireless, cellular, or any other transmission medium.

Collaborative Electronic Design Automation

Figure 4:
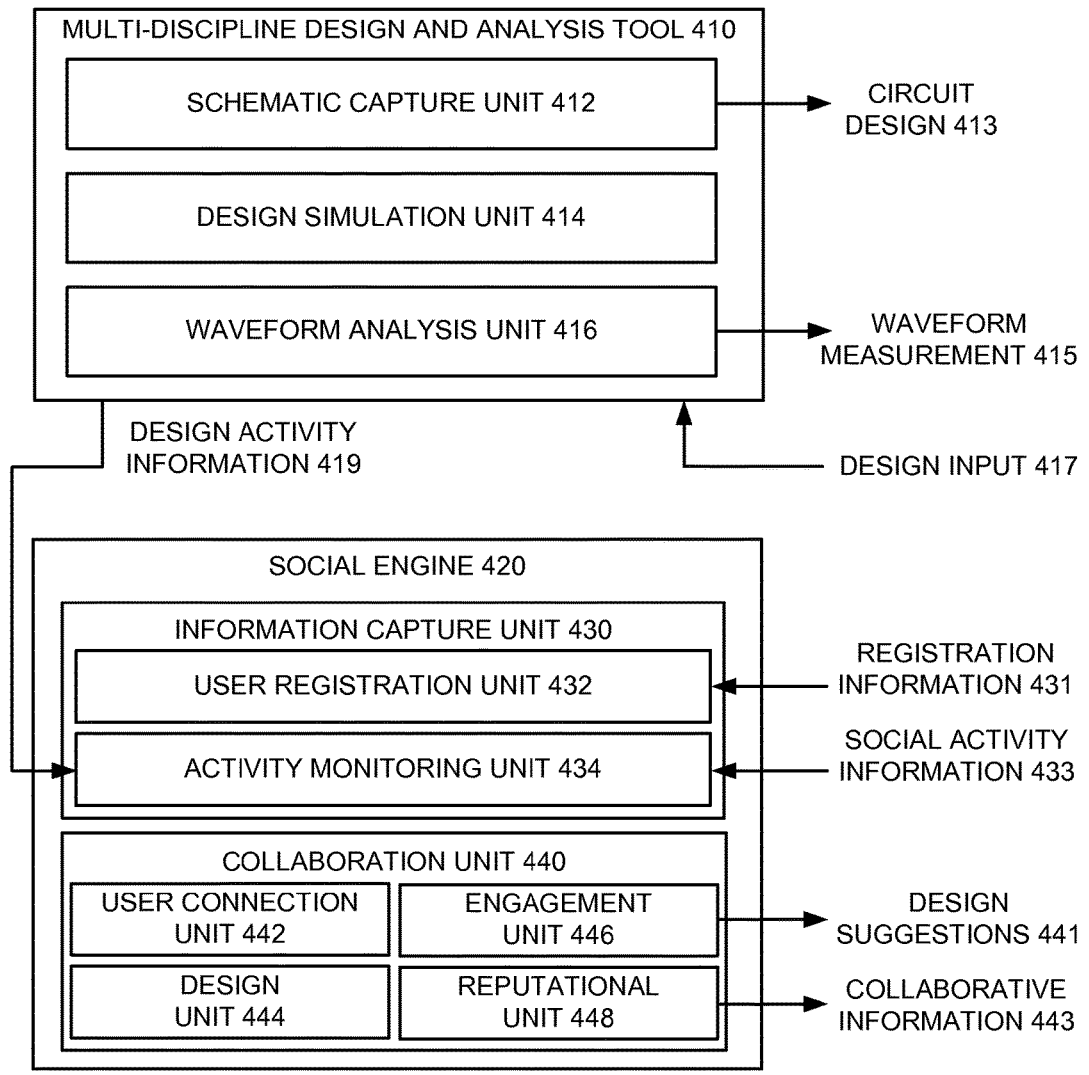
FIG. 4 illustrates an example electronic design automation tool and social engine implementing a collaborative electronic design environment according to various examples of the invention.

FIG. 4 illustrates an example electronic design automation tool and social engine implementing a collaborative electronic design environment according to various examples of the invention. Referring to FIG. 4, the electronic design automation tool, such as a multi-discipline design and analysis tool 410, can allow user development and analysis of a circuit design 413 modeling an electronic device.

The multi-discipline design and analysis tool 410 can include a schematic capture unit 412 to present a design environment in a display window corresponding to one or more of the client devices 322-1 to 322-M, for example, allowing the client devices 322-1 to 322-M to generate a design schematic representing at least a portion of the electronic device in response to user input. The schematic capture unit 412 can receive the design schematic from the client devices 322-1 to 322-M as design input 417 and generate the circuit design 413 in response to the design input 417. In some embodiments, the s design environment can allow user to generate embedded software code, for example, for use by a control circuit of the electronic device, which the schematic capture unit 412 can receive in the design input 417 from the client devices 322-1 to 322-M.

Since the multi-discipline design and analysis tool 410 can support various design modeling languages, such as Simulation Program with Integrated Circuit Emphasis (SPICE) languages, at least one hardware description language (HDL), transfer function languages, and the like, the schematic capture unit 412 can generate the circuit design 413 in multiple different forms and modeling the electronic device at different levels of abstraction. In some embodiments, the schematic capture 412 can convert the design input 417 into a circuit design 413 that models the electronic device at a register transfer level (RTL), for example, with a hardware description language (HDL), such as Verilog, Very high speed integrated circuit Hardware Design Language (VHDL), SystemC, or the like. The schematic capture 412 can convert the design 417 input into a circuit design 413 that models the electronic device at a transistor-level with a SPICE programming language. In some examples, the schematic capture unit 412 can further synthesize the circuit design 413 modeling the electronic device at the register transfer level (RTL) model into a gate-level netlist, which can represent the electronic device as a network of devices.

The multi-discipline design and analysis tool 410 can include a design simulation unit 414 to simulate and/or analyze the circuit design 413, for example, to identify defects or improper functioning in the circuit design 413. In some embodiments, the design simulation unit 414 can simulate the circuit design 413 in response to test stimulus, for example, based on input from a user, such as a test bench received from the client devices 322-1 to 322-M. The design simulation unit 414 can generate waveform data corresponding to the operation of the circuit design 413 in response to the test stimulus. The design simulation unit 414 can provide the waveform data to the corresponding client device 322-1 to 322-M, allowing user modification of the circuit design 413 based on the waveform data. In some embodiments, the multi-discipline design and analysis tool 410 can utilize one or more emulation devices to simulate the circuit design 413, for example, with at least one of the emulation devices 314-1 to 314-M.

The multi-discipline design and analysis tool 410 can include a waveform analysis unit 416 to measure the waveform data generated by the design simulation unit 414 and generate a waveform measurement 415. The waveform analysis unit 416 can provide the waveform measurement 415 to the corresponding client device 322-1 to 322-M, allowing user modification of the circuit design 413 based on the waveform measurement 415.

A social engine 420 can adapt the design environment that the multi-discipline design and analysis tool 410 presents to the client devices 322-1 to 322-M based, at least in part, on information associated with the users of the multi-discipline design and analysis tool 410. The social engine 420 can include an information capture unit 430 to capture information associated with users of the multi-discipline design and analysis tool 410, such as design activity information 419, register information 431, social activity information 433, or the like. The social engine 420 can include a collaboration unit 440 to adapt the design environment based on the information captured by the information capture unit 430, for example, by generating design suggestions 441, collaborative information 443, or the like, for insertion into the display window presented at the client devices 322-1 to 322-N.

The information capture unit 430 can include a user registration unit 432 to receive registration information 431 corresponding to a user, such as demographic information, social information, employment information, educational information, or the like, and, in some embodiments, grant the user access to the multi-discipline design and analysis tool 410 in response to the registration information 431. The user registration unit 432 can receive the registration information 431 from the client devices 322-1 to 322-M, for example, via a registration or login page in a display window. In some embodiments, the registration information 431 can include authorization to register with a social login, for example, to a social network website, such as Facebook, LinkedIn, Twitter, Goggle+, Instagram, which can allow the user registration unit 432 to gather various types of information on the user, such as the demographic information, the social information, the employment information, education information or the like, from the corresponding social network web site. The social information can include a social graph of friends or other connections in the social network website, groups the user has joined, interests or hobbies of the user, or the like.

The information capture unit 430 can include an activity monitoring unit 434 to gather information based on activities of the users utilizing the multi-discipline design and analysis tool 410. The activity monitoring unit 434 can monitor the design activity of users, for example, by reviewing schematics, design input 417, or circuit designs 413, to identify when the users utilize the multi-discipline design and analysis tool 410, identify types of electronic devices or systems the user designs, identify components or specific component manufacturers utilized by the users, identify a current stage of the design process, identify areas of the design process that impede the users progress, or the like.

The activity monitoring unit 434 also can receive social activity information 433, for example, from the client devices 322-1 to 322-M, which can identify socially-based activities performed by users. In some examples, the social activity information 433 can identify other users of the multi-discipline design and analysis tool 410 that a user has interacted with and the context of the interaction, such as which users were followed or "friended" by the user, interacted with in a forum or a group, had their design interacted with, such as viewed, followed, recommended or "liked", commented, copied, subsumed into one of their own designs, or the like. The social activity information 433 can identify social information users have populated into their own designs, such as design tags identifying a type of electronic system the design intends to model, searchable comments inserted into a design or corresponding forum associated with the design or design process, or the like. The social activity information 433 can identify when the users utilize the multi-discipline design and analysis tool 410 for social or collaborative activities, or the like.

The collaboration unit 440 can adapt the design environment for the multi-discipline design and analysis tool 410 based on the information captured by the information capture unit 430, for example, by generating design suggestions 441, collaborative information 443, or the like, for insertion into the display window presented at the client devices 322-1 to 322-N. In some embodiments, the collaboration unit 440 can correlate design activity information 419, registration information 431, and/or social activity information 433 of different users, identify commonalities between the correlated information, and generate any design suggestions 441 or collaborative information 443 based on the commonalities. Embodiments of generating the design suggestions 441 and collaborative information 443 will be described below in greater detail.

The collaboration unit 440 can include a user connection unit 442 to generate a social network for users of the multi-discipline design and analysis tool 410, for example, by recording user-to-user interconnections based on the registration information 431 and the social activity information 433. The user-to-user interconnections can be explicit, for example, user connections or followers created within the social network of the multi-discipline design and analysis tool 410 and/or user connections or followers created in another social network identified through the registration information 431.

The user connection unit 442 can also identify implied connections or similarities between users based on the registration information 431 and the social activity information 433. For example, the user connection unit 442 can determine that multiple users share one or more common traits or characteristics, such as demographic information, employment information, educational information, design activity, group membership, forum contribution, or the like, and link those users in the based on those common traits or characteristics. In some instances, the collaboration unit 440 can generate collaborative information 443 based on the implied link between users, such as suggesting that they become "friends" in the social network of the multi-discipline design and analysis tool 410, invite them to join the same group, which may be generated by the collaboration unit 400 based, at least in part, on the implied link.

The collaboration unit 440 can include a design unit 444 to record circuit designs and development activity of users through the various stages of the design process, for example, in response to the design activity information 419. The design unit 444 also can record social activity associated with the circuit designs, such as forums corresponding to the circuit designs, followers of the circuit designs, recommendations of the circuit designs, user-generated social tags of the circuit designs, or the like, from the social activity information 433. The collaboration unit 440 can utilize the recorded information to determine various attributes of the circuit designs, for example, identify a type of electronic device or system the user intends to model with the circuit design and classify the circuit design accordingly, identify a stage of development of the circuit design, or the like. In some embodiments, the collaboration unit 440 can classify the circuit designs by comparing the user-generated social tag of the circuit design to known circuit design types, comparing the structure of the circuit design to other circuit designs in the design unit 444, reviewing the content in the forums corresponding to the circuit design, reviewing backgrounds of the users developing, commenting, viewing, or utilizing the circuit design, or the like.

The collaboration unit 440 can include an engagement unit 446 to identify quantity, frequency, and type of activity by different users on the multi-discipline design and analysis tool 410. In some embodiments, the engagement unit 446 can generate an engagement score for the users based on the identified activity, which can attempt to quantify user experience and expertise with the multi-discipline design and analysis tool 410 and the area of design corresponding to at least one circuit design classification.

The collaboration unit 440 can include a reputational unit 448 to identify a relative importance or value of circuit designs based, at least in part, on crowd-sourced information from users of the multi-discipline design and analysis tool 410. The relative importance or value of circuit designs can be attributable to different aspects of the design or design process, such as attributable to the overall design, the libraries utilized, the component parts utilized, the parameters of selected component parts, or the like. For example, the social activity information 433 can track and analyze circuit design views, forum comments, reputation tags or "likes", and other activities, such as copying portions of a circuit design, building upon an existing circuit design, or the like, to determine which circuit designs or specific attributes of circuit designs have a higher relative importance or value in different circuit designs classifications.

The collaboration unit 440 can generate design suggestions 441 for insertion into the display window presented at the client devices 322-1 to 322-N based on crowd-sourced information from the user connection unit 442, the design unit 444, the engagement unit 446, and/or the reputational unit 448. The design suggestions 441 can include a suggestion to use circuit design developed by a different user, a suggestion of a different part library utilized by one or more different users, a suggestion of a component part utilized by one or more different users, a suggestion of certain parameters for a selected component part utilized by one or more different users, or the like. Given a circuit design classification and possibly a stage of the circuit design development, the collaboration unit 440 can select designs, libraries, component parts, or parameters for a selected part to present as design suggestions 441, which have a greater reputation among users, or which were utilized by users that are your connected "friends" and/or that have a greater engagement score. In some embodiments, the suggestion of circuit designs, libraries, component parts, and parameters also may be based on external factors, such as availability of the component parts during manufacture, the cost of the component parts during manufacture, the compatibility of the component parts with the fabrication processes, partnership deals with the social engine 420, or the like.

When a user has a completed or nearly completed design, the collaboration unit 440 may suggest a new electronic design automation tool for the next stage in the development flow towards manufacture of the electronic device modeled by the circuit design 413. The type of electronic design automation tool the collaboration unit 440 selects to suggest to the user can be based on the classification of the circuit design, the complexity of the design, type of fabrication or manufacturing process to be utilized, or the like. This suggestion of a new electronic design automation tool may be presented to the user via the display window in the design environment or the collaboration unit 440 may forward contact information of the user to a sales representative for the electronic design automation tool that the collaboration unit 440 determined to suggest to the user, for example, to be utilized in a targeted marketing or sales call of the user or the user's company.

The collaboration unit 440 can generate collaborative information 443 for insertion into the display window presented at the client devices 322-1 to 322-N based on the information from the user connection unit 442, the design unit 444, the engagement unit 446, and/or the reputational unit 448. The collaborative information 443 can include suggestions of different users to connect with in the social network of the multi-discipline design and analysis tool 410, suggestions of designs to follow, suggestions of groups to join for the multi-discipline design and analysis tool 410, or the like. The collaboration unit 440 can generate collaborative information 443 based on other connections in the social graph of the multi-discipline design and analysis tool 410, similarities in demographics, employment, education, joined groups, interests or hobbies, with another user, recorded design activity, such as common interaction in a forum, in a common design with another user, or the like. In some embodiments, the collaboration unit 440 can identify users with a common design interest and generate collaborative information 443 that requests they join a group for that common design interest, which may be, in some cases, automatically generated by the collaboration unit 440 in response to identifying a threshold number of users have a similar design interest.

The collaboration unit 440 also can render the forums corresponding to circuit designs or groups, searchable within the multi-discipline design and analysis tool 410 or over the Internet. In some embodiments, the design unit 444 can render selective portions of content in the multi-discipline design and analysis tool 410 available for public inspection without first having to provide registration information 431 in order to advertise the presence and illustrate example collaborative content available in the multi-discipline design and analysis tool 410.

Although FIG. 4 shows the social engine 420 as being separate from the multi-discipline design and analysis tool 410, in some embodiments, the social engine 420 can be integrated into the multi-discipline design and analysis tool 410. The social engine 420 can, in some embodiments, communicate the design suggestions 441 and the collaborative information 443 to the multi-discipline design and analysis tool 410, and the multi-discipline design and analysis tool 410 can incorporate them into the design environment.

The social engine 420 need not be utilized with a single electronic design automation tool, but can be utilized with multiple different electronic design automation tools. This may allow the social engine 420 to connect users at different stages of the overall design process, for example, which may allow front-end design users to understand some of the back-end implications of the their design choices, such as component part selection, parameter selection, design layout, or the like, and vis versa.

Figure 5:
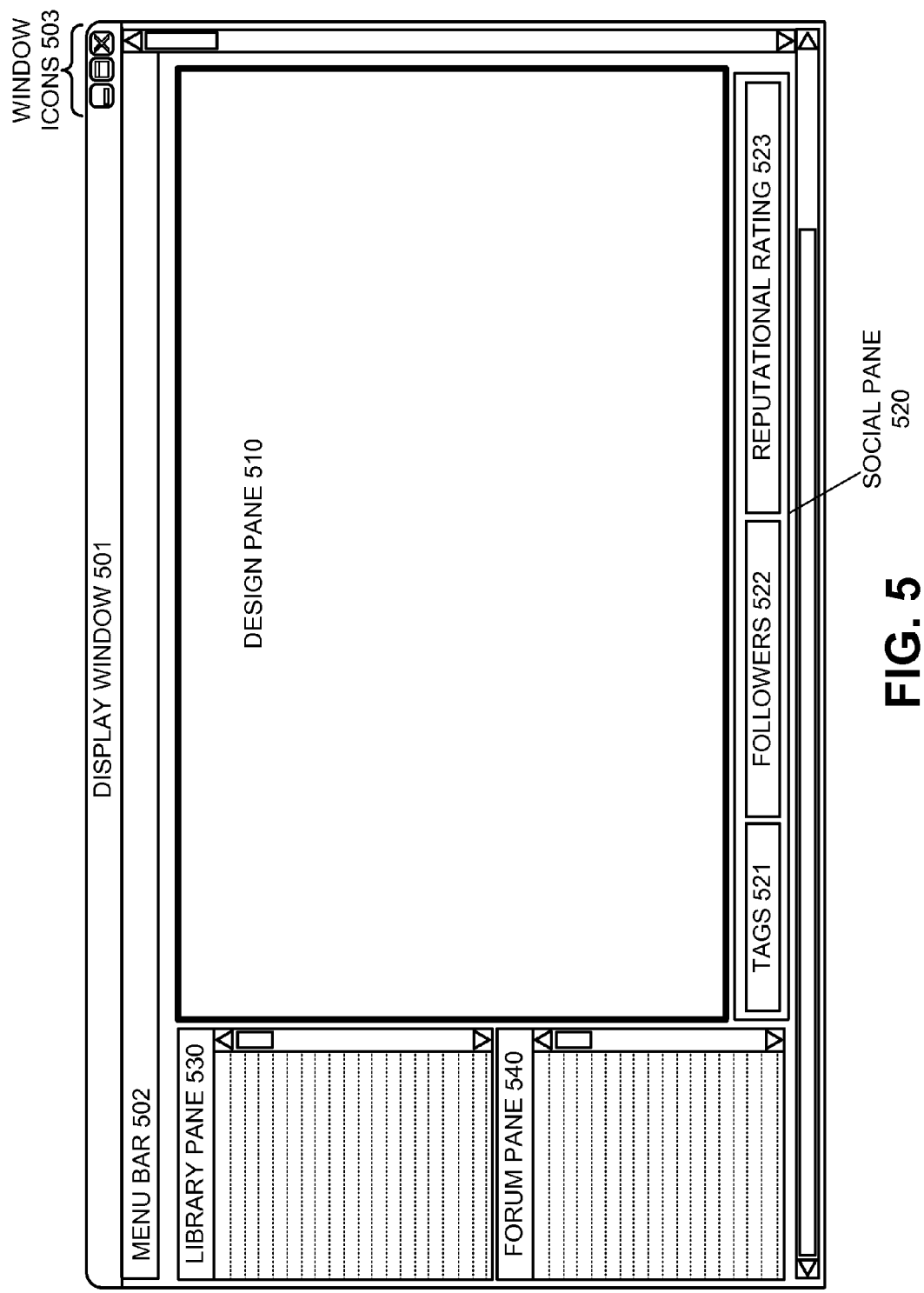
FIG. 5 illustrates an example display window for development of a circuit design in a collaborative electronic design environment according to various examples of the invention.

FIG. 5 illustrates an example display window 501 for development of a circuit design in a collaborative electronic design environment according to various examples of the invention. Referring to FIG. 5, the display window 501 can include a menu bar 502, a design pane 510, a social pane 520, a library pane 530, and a forum pane 540. The design pane 510 can include an area available for development of a schematic for a circuit design.

The library pane 530 can include a listing of various component parts, which may be utilized to help build the schematic for the circuit design. The display window 501 can allow for the component parts in the library pane 530 to be dragged onto the design pane 510 for placement in the schematic of the circuit design. In some embodiments, the order of the component parts in the library pane 530 can be adjusted based on design suggestions for example, from crowd-sourced information. Thus, when a schematic for the circuit design is in development, the collaborative electronic design environment can suggest a component part or family of component parts, for example, by providing a pop-up notification or re-ordering component parts in the library pane 530 in an attempt to anticipate the designer's next step in the design process. Further, when a component part has been selected and placed in the design pane 510, the design pane 510 can present suggested parameters for the selected component part.

The social pane 520 can include multiple fields, such as a tags field 521, a followers field 522, and a reputational rating field 523. The tags field 521 can include a list of one or more tags that characterize the circuit design in the design pane 510. The tags can be entered or selected by the designer, for example, to define a type of electronic device to be model by the circuit design. In some embodiments, the collaborative electronic design environment can automatically generate one or more tags for the circuit design based on a comparison of the circuit design in the design pane 510 to circuit designs developed by other users of a collaborative electronic design tool.

The followers field 522 can identify other users of the collaborative electronic design tool that are following the circuit design in the design pane 510. The reputational rating field 523 can identify reputational rating of the circuit design in the design pane 510 by other users of the collaborative electronic design tool, for example, a number of "like," "thumbs up," "thumbs down" selections by the other users. In some embodiment, the collaborative electronic design tool can automatically generate a reputational rating based on grading or selections by other users, which may take into account a relative esteem of the other users.

The forum pane 540 can include a listing of comments on the circuit design in the design pane 510, and optionally, an identification of a user, date, and time associated with the comment. In some embodiments, each comment also can have a corresponding reputational rating, which can be displayed in the forum pane 540. Thus, a designer of a circuit design in the design pane 510 can receive collaborative help in developing the circuit design through various automated suggestions by the collaborative electronic design tool as well as user suggestions via comments in the forum pane 540.

The display window 501 can include a menu bar 502 having various mechanisms to selectively populate, sort, organize, and/or filter the library pane 630, or schematic drawing utilities or embedded software code generation utilities for the design pane 510. The display window 501 also can include window icons 503, which can control sizing of the display window 501, such as enlarging, shrinking, minimizing, or the like, and closing of the display window 501.

Figure 6:
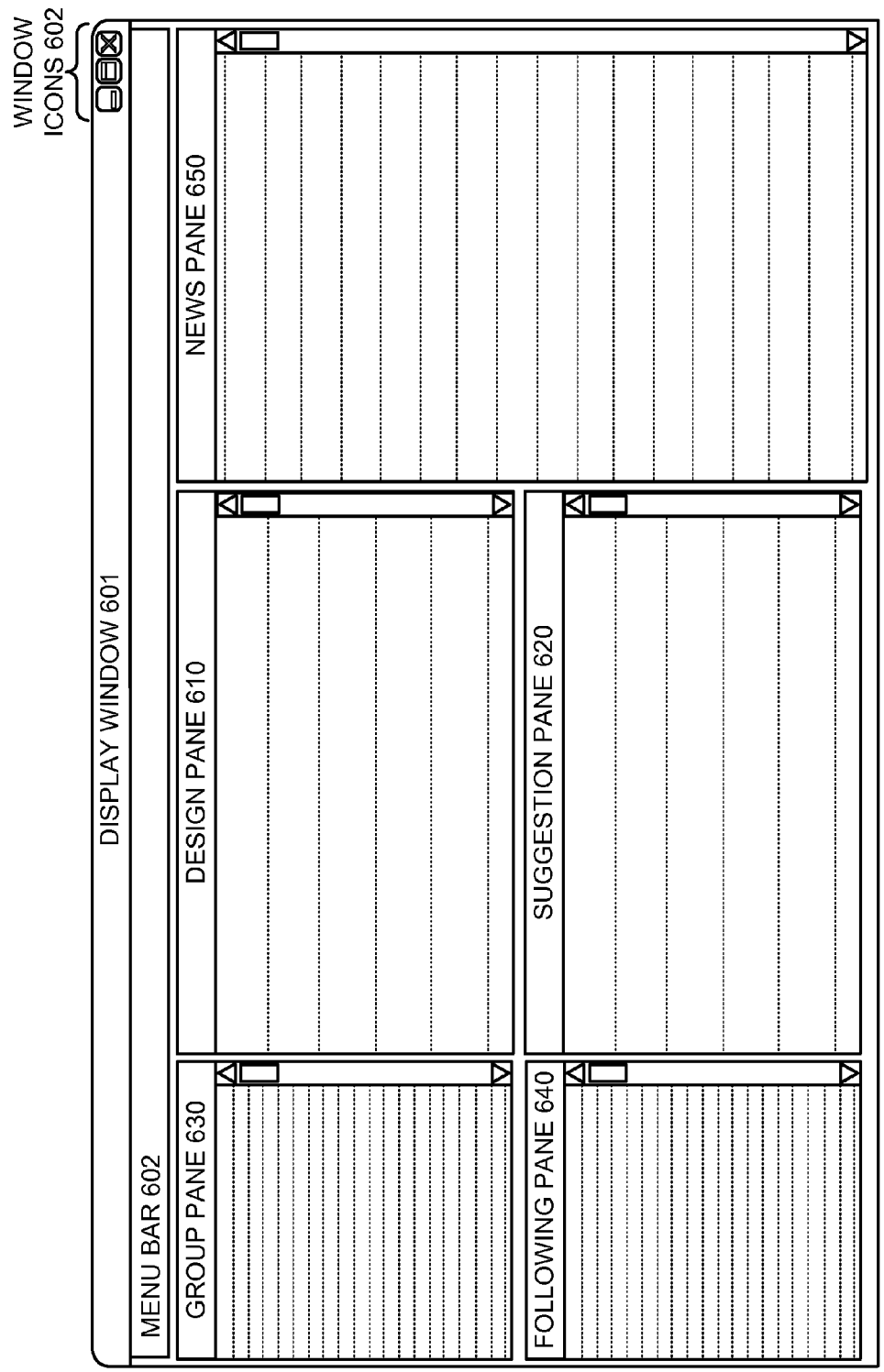
FIG. 6 illustrates an example display window for collaborative electronic design according to various examples of the invention.

FIG. 6 illustrates an example display window for collaborative electronic design according to various examples of the invention. Referring to FIG. 6, the display window 601 can include a menu bar 602, a design pane 610, a suggestion pane 620, a group pane 630, a following pane 640, and a news pane 650. The design pane 610 can include a listing of one or more circuit designs associated with a user of a collaborative electronic design tool.

The suggestion pane 620 can include a listing of one or more design or collaborative suggestions for the user of the collaborative electronic design tool. For example, the suggestion pane 620 can include example circuit designs, libraries, component parts, parameters for component parts, simulation or testing schemes, or the like, available to the user in developing one or more circuit designs. The suggestion pane 620 also can include one or more collaborative suggestions, such as groups for the user to join, other users to "friend" in the social network of the collaborative electronic design tool, circuit designs to follow in the collaborative electronic design tool, suggestions to rate other user's work in the collaborative electronic design tool, or the like.

The group pane 630 can include a listing of one or more groups the user has joined in the collaborative electronic design tool. The following pane 640 can include a listing of one or more circuit designs the user has followed in the collaborative electronic design tool. The news pane 650 can include a listing of information posted in a group that the user has joined, information posted in a forum of a circuit design the user has followed, a comment another user has posted on one of the users circuit designs, a direct message to the user from another user, such as a "friend" request, an invitation to follow a circuit design of the other user or to join a group, request for help in the development of a circuit design, or the like.

The display window 601 can include a menu bar 602 having various mechanisms to selectively populate, erase entries, sort, organize, and/or filter the panes 610-650. The display window 601 also can include window icons 603, which can control sizing of the display window 601, such as enlarging, shrinking, minimizing, or the like, and closing of the display window 601.

Figure 7:
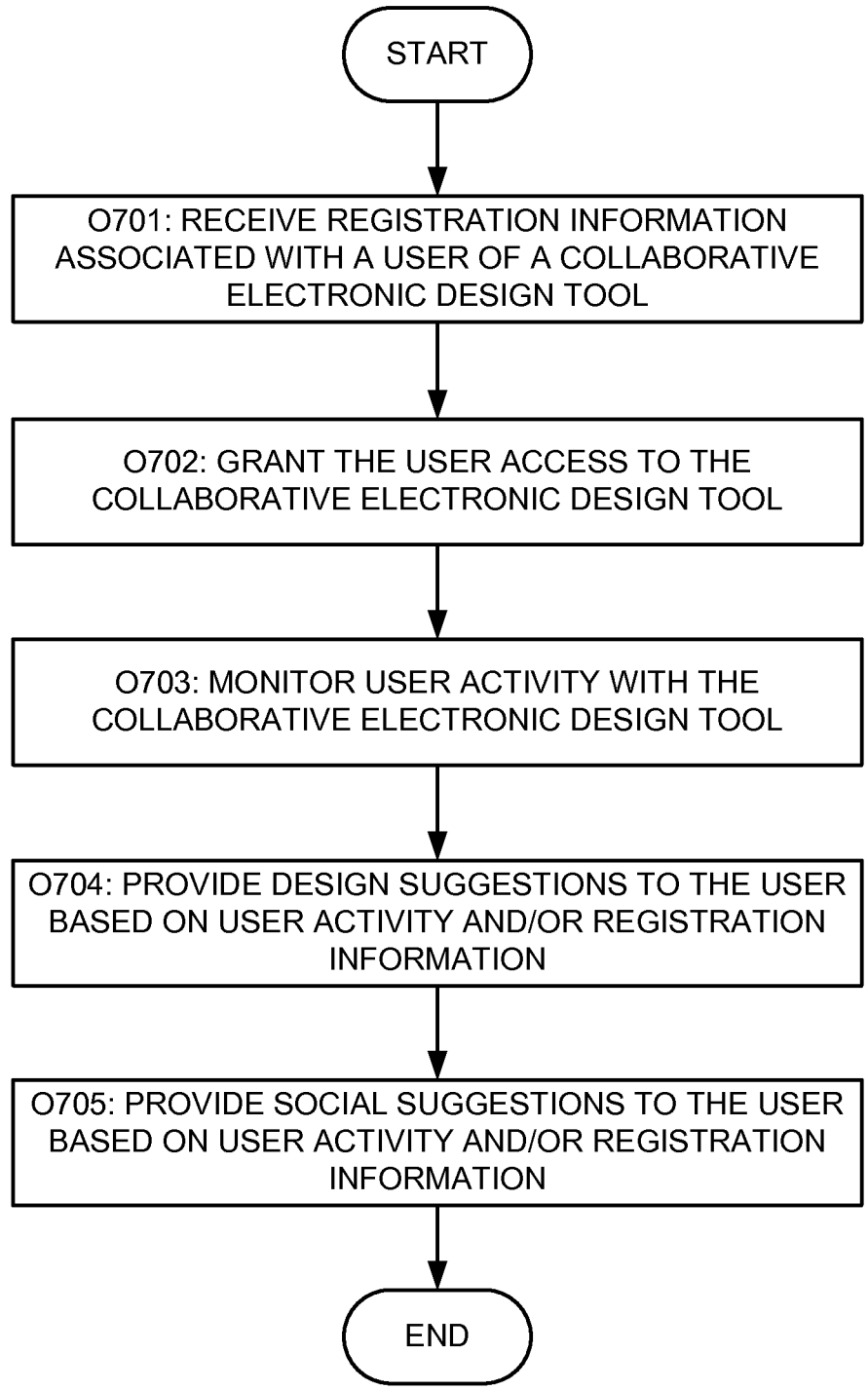
FIG. 7 illustrates a flowchart showing an example implementation of a collaborative electronic design environment according to various examples of the invention.

FIG. 7 illustrates a flowchart showing an example implementation of a collaborative electronic design environment according to various examples of the invention. Referring to FIG. 7, in a block 701, a social engine can receive registration information associated with a user, and, in a block 702, the social engine can grant the user access to the collaborative electronic design environment in response to the registration information. The registration information can include demographic information, social information, employment information, educational information, or the like. The social information can include a social graph of friends or other connections in the social network website, groups the user has joined, interests or hobbies of the user, or the like. In some embodiments, the registration information can include authorization to register with a social login, for example, to a social network website, such as Facebook, LinkedIn, Twitter, Goggle+, Instagram, which can allow the social engine to gather the registration information from the corresponding social network website with the social login.

In a block 703, the social engine can monitor user activity in the collaborative electronic design environment. For example, the social engine can review schematics, design input, or circuit designs, to identify when the users utilize the collaborative electronic design tool, identify types of electronic devices or systems the user designs, identify components or specific component manufacturers utilized by the users, identify a current stage of the design process, identify areas of the design process that impede the users progress, or the like.

The social engine also can monitor socially-based activities performed by users, for example, to identify other users of the collaborative electronic design tool that a user has interacted with and the context of the interaction, such as which users were followed or "friended" by the user, interacted with in a forum or a group, had their design interacted with, such as viewed, followed, recommended or "liked", commented, copied, subsumed into one of their own designs, or the like. The social engine also can identify social information users have populated into their own designs, such as design tags identifying a type of electronic system the design intends to model, searchable comments inserted into a design or corresponding forum associated with the design or design process, or the like.

In a block 704, the social engine can provide design suggestions to the user in the collaborative electronic design environment based on the user activity and/or the registration information. For example, the design suggestions can include a suggestion to use circuit design developed by a different user, a suggestion of a different part library utilized by one or more different users, a suggestion of a component part utilized by one or more different users, a suggestion of certain parameters for a selected component part utilized by one or more different users, or the like.

In some embodiments, the social engine can correlate the monitored user activity and the registration information of different users, identify commonalities between the different users or their corresponding designs based on the correlated information, and then generate any design suggestions based on the commonalities. Given a circuit design classification and possibly a stage of the circuit design development, the social engine can select designs, libraries, component parts, or parameters for a selected part to present as design suggestions, which have a greater reputation among users, or which were utilized by users that are your connected "friends" and/or that have a greater engagement score. In some embodiments, the suggestion of circuit designs, libraries, component parts, and parameters also may be based on external factors, such as availability of the component parts during manufacture, the cost of the component parts during manufacture, the compatibility of the component parts with the fabrication processes, partnership deals with the social engine, or the like.

In a block 705, the social engine can provide social suggestions to the user in collaborative electronic design environment based on the user activity and/or the registration information. The social suggestions can include suggestions of different users to connect with in the social network of the collaborative electronic design environment, suggestions of designs to follow, suggestions of groups to join in the collaborative electronic design environment, or the like. The social engine can generate the social suggestions based on other connections in the social graph of the collaborative electronic design environment, similarities in demographics, employment, education, joined groups, interests or hobbies, with another user, recorded design activity, such as common interaction in a forum, in a common design with another user, or the like. In some embodiments, the social engine can identify users with a common design interest and generate a social suggestion that requests they join a group for that common design interest, which may be, in some cases, automatically generated by the social engine in response to identifying a threshold number of users have a similar design interest.

Figure 8:
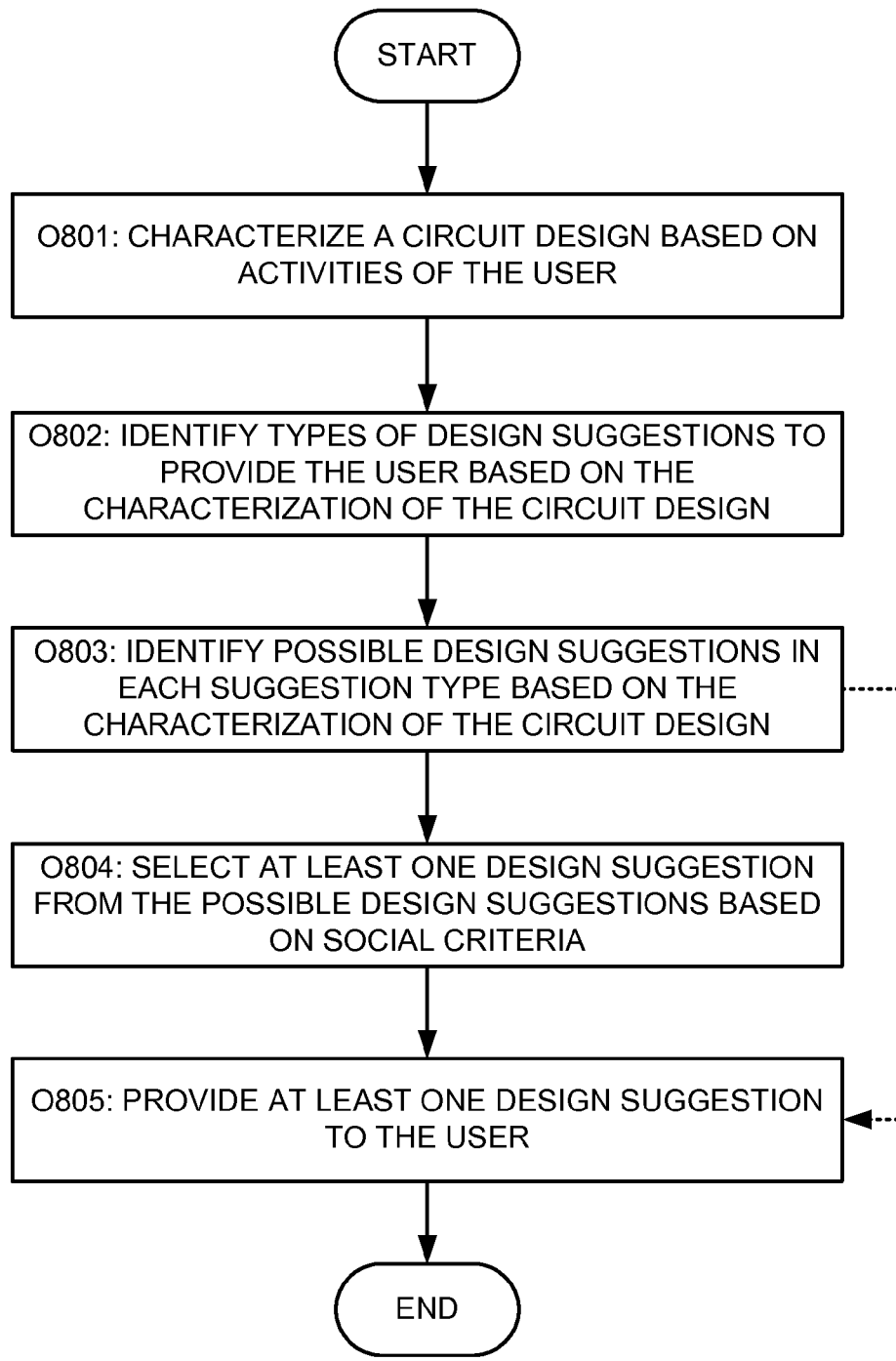
FIG. 8 illustrates a flowchart showing another example implementation of a collaborative electronic design environment according to various examples of the invention.

FIG. 8 illustrates a flowchart showing another example implementation of a collaborative electronic design environment according to various examples of the invention. Referring to FIG. 8, in a block 801, a social engine can characterize a circuit design based on activities of the user. The social engine can characterize the circuit design by determining various attributes of the circuit design, for example, identify a type of electronic device or system the user intends to model with the circuit design and classify the circuit design accordingly, identify a stage of development of the circuit design, or the like. In some embodiments, the social engine can classify the circuit designs by comparing a user-generated social tag of the circuit design to known circuit design types, comparing the structure of the circuit design to other circuit designs in the social engine, reviewing the content in the forums corresponding to the circuit design, reviewing backgrounds of the users developing, commenting, viewing, or utilizing the circuit design, or the like.

In a block 802, the social engine can identify types of design suggestions to provide the user based on the characterization of the circuit design. The types of design suggestions can include a suggestion to use circuit design developed by a different user, a suggestion of a different part library utilized by one or more different users, a suggestion of a component part utilized by one or more different users, a suggestion of certain parameters for a selected component part utilized by one or more different users, or the like.

In a block 803, the social engine can identify possible design suggestions in each suggestion type based on the characterization of the circuit design. Given a circuit design classification, the social engine can select designs, libraries, component parts, or parameters for a selected part to present as design suggestions. For example, when a user initiates the design process, the social engine may suggest completed designs that the user may wish to utilize and/or modify rather than "start from scratch" creating a new design. The social engine can identify which type of the completed designs to suggest based on knowledge of the user's background, for example, from the registration information, knowledge of the user's previous design activity in the collaborative design environment, a user-generated tag for the new design, or the like. When the user is in the middle of generating a design, the social engine can suggest certain libraries, parts, or parameters, for example, which other users designing similar circuits utilized in their designs, offer parts that are available during manufacturing, offer parts that are coherent with the rest of the design. The social engine also may identify already completed design similar to the current design the user is creating and suggest the already completed design at this time. When the user design is complete, the social engine can suggest testing strategies, test benches, or the like, for the user to implement for simulation of the completed design. If during simulation, a completed design has an error or fault, the social engine can offer design changes, which may have worked to resolve a similar error or fault previously.

In a block 804, the social engine can select at least one design suggestion from the possible design suggestions based on social criteria. For example, prior to providing any suggestion to the user, the social engine can filter the possible suggestions based on reputational information, for example, providing those design suggestions that have a greater reputation among users, or which were utilized by users that are your connected "friends" and/or that have a greater engagement score. The design or designer reputation can be based on the engagement of the user with the collaborative electronic design environment, social reputational ratings provided by other users of the collaborative electronic design environment, or the like.

In a block 805, the social engine can provide at least one design suggestion to the user. In some embodiments, the social engine inserts the design suggestion into the collaborative electronic design environment, while, in other embodiments, the social engine provides the design suggestion to the tool implementing the collaborative electronic design environment for insertion.

Figure 9:
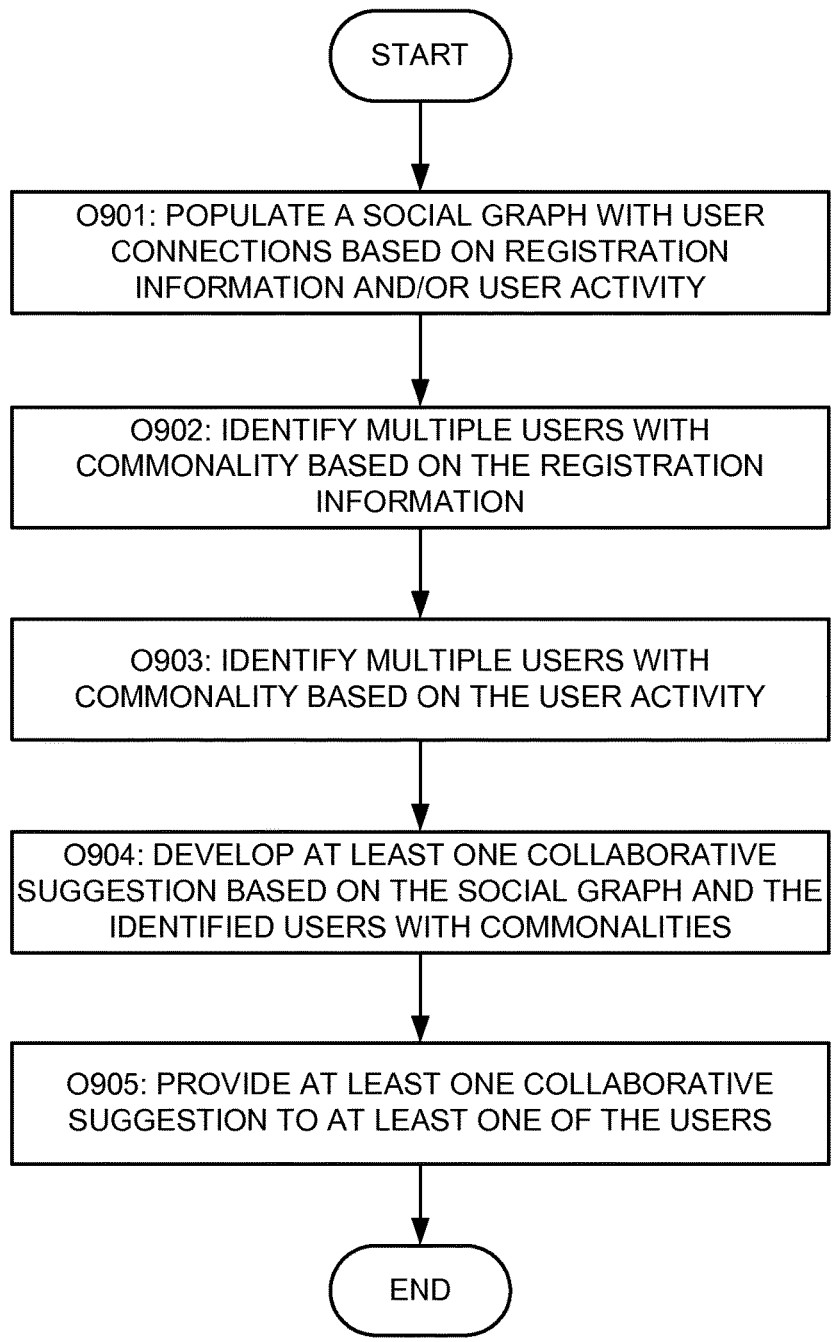
FIG. 9 illustrates a flowchart showing yet another example implementation of a collaborative electronic design environment according to various examples of the invention.

FIG. 9 illustrates a flowchart showing yet another example implementation of a collaborative electronic design environment according to various examples of the invention. Referring to FIG. 9, in a block 901, a social engine can populate a social graph with user connections based on registration information and/or user activity with a collaboration electronic design tool. The social engine can build a social graph of its users based on the connections established while using the collaboration electronic design tool, or connections made in a different social network that were identified via the registration information.

In a block 902, the social engine can identify multiple users with commonality based on the registration information. The social engine can compare registration information of its users to determine commonality, for example, comparing employment history, educational background, common social network connections, or the like.

In a block 903, the social engine can identify multiple users with commonality based on the user activity with the collaboration electronic design tool. The social engine can compare activity of its users to determine commonality, for example, comparing design activity in the collaborative electronic design environment, social activity in the collaborative electronic design environment, or the like.

In a block 904, the social engine can develop at least one collaborative suggestion based on the social graph and the identified users with commonalities. The collaborative suggestions can include groups for the users to join, connections for the users to make in the social network, designs for the users to follow, or the like.

In a block 905, the social engine can provide at least one collaborative suggestion to at least one of the users. In some embodiments, the social engine inserts the collaborative suggestion into the collaborative electronic design environment, while, in other embodiments, the social engine provides the collaborative suggestion to the tool implementing the collaborative electronic design environment for insertion.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    displaying, by a computing system on a display device, a display window that, in response to activity of a user, allows a design tool to generate a circuit design describing an electronic system:
    identifying, by the computing system, the activity of the user on the design tool by reviewing the circuit design describing the electronic system that was generated in response to the activity of the user on the design tool;
    comparing, by the computing system, the activity of the user that prompted the generation of the circuit design by the design tool to previous design activities of one or more different users of the design tool to identify a commonality between the circuit design describing the electronic system and previous design activities of the one or more different users;
    selecting, by the computing system, a design suggestion for development of the circuit design describing the electronic system based, at least in part, on the commonality between the activity of the near and previous design activities of the one or more different users and based on a reputational rating for a circuit design associated with the design suggestions, wherein the reputational rating was formed based, at least in part, on the previous design activities of the one or more different users; and
    displaying, by the computing system, the selected design suggestion for the development of the circuit design describing the electronic system in the display window on the display device available to the user.

2. The method of claim 1, further comprising:
    collecting, by the computing system, registration information associated with the user; and
    granting, by the computing system, the user access to the design tool in response to registration, information associated with the user.

3. The method of claim 2, wherein collecting the registration information associated with the user further comprises:
    receiving, by the computing system, login credentials corresponding to a social networking website from the user; and
    extracting, by the computing system, social information from the social networking website in response to the login credentials, wherein the social information includes one or more of a social graph for the user, employment history of the user, or demographics of the user.

4. The method of claim 2, further comprising prompting, by the computing system, presentation of collaborative suggestions on the display device available to the user based, at least in part, on the registration information from the user and the activity of the user on the design tool.

5. The method of claim 4, wherein the collaborative suggestions include a recommendation for the user to follow another user of the design tool or to follow design objects including at least one of a circuit design, a simulation of the circuit design, waveform data corresponding to the simulation, a waveform measurement, a model of the circuit design, a report, a forum corresponding to the circuit design.

6. The method of claim 1, wherein the activity of the user on the design tool includes generating or modifying a circuit design, prompting a simulation of the circuit design, prompting analysis of waveform data generated during the simulation of the circuit design, or socially interacting with at least one of the different users of the design tool.

7. The method of claim 1, wherein the design suggestions include at least one of a suggested part within a library in a display window, a different library in the display window, suggested parameters of a user selected part, a suggested circuit design developed by at least one of the different users of the design tool, a suggested circuit design stimulation, a suggested analysis of a circuit design simulation, or a suggested report template.

8. A system comprising:
a memory system configured to store computer-executable instructions; and
a computing system, in response to execution of the computer-executable instructions, is configured to:
display, on a display device, a display window that, in response to activity of a user, allows a design tool to generate a circuit design describing an electronic: system;
identify the activity or the viewer on the design tool by reviewing the circuit design describing the electronic system that was generated in response to the activity of the user on the design tool;
compare the activity of the user that promoted the generation of the circuit design by the design tool to previous design activities of one or more different users of the design tool to identify a commonality between the circuit design describing the electronic system and previous design activities or the one or more different users:
select a design suggestion for development of the circuit design describing the electronic system based, at least in part, on the commonality between the activity of the user and previous design activities of the one or more different users and based on a reputational rating for a circuit design associated with the design suggestion, wherein the reputational rating was formed based at least in part on the previous design activities of the one or more different users; and
display the selected design suggestion for the development of the circuit design describing the electronic system in the display window on the display device available to the user.

9. An apparatus comprising at least one computer-readable memory device storing instructions configured to cause a computing system to perform operations comprising:
displaying, on a display device, a display window that, in response to activity of a user, allows a design tool to generate a circuit design describing an electronic system;
identifying the activity of the user on the design tool by reviewing the circuit design describing the electronic system that was generated in response to the activity of the user on the design tool;
comparing the activity of the user that prompted the generation of the circuit design by the design tool to previous design activities of one or more different users of the design tool to identify a commonality between the circuit design describing the electronic system and previous design activities of the one or more different users;
selecting a design suggestion for development of the circuit design describing the electronic system based, at least in part, on the commonality between the activity of the user and previous design activities of the one or more different users and based on a reputational rating for a circuit design associated with the design suggestion, wherein the reputational rating was formed based, at least in part on the previous design activities of the one or more different users; and
displaying the selected design suggestion for the development of the circuit design describing the electronic system in the display window on the display device available to the user.

10. The apparatus of claim 9; wherein the instructions are configured to cause the computing system to perform operations further comprising:
collecting registration information associated with the user; and
granting the user access to the design tool in response to registration information associated with the user.

11. The apparatus of claim 10, wherein collecting the registration information associated with the user further comprises:
receiving login credentials corresponding to a social networking website from the utter; and
extracting social information from the social networking website in response to the login credentials, wherein the social information includes one or more of a social graph for the user, employment history of the user, or demographics of the user.

12. The apparatus of claim 10, wherein the instructions are configured to cause the computing system to perform operations farther comprising prompting presentation of collaborative suggestions on the display device available to the user based, at leant in part, on the registration information from the user and the activity of the user on the design tool.

13. The apparatus of claim 12, wherein the collaborative suggestions include a recommendation for the user to follow another user of the design tool or to follow design objects including at least one of a circuit design, a simulation of the circuit design, waveform data corresponding to the simulation, a waveform measurement, a model of the circuit design, a report, a forum corresponding to the circuit design.

14. The apparatus of claim 9, wherein the activity of the user on the design tool includes generating or modifying a circuit design, prompting a simulation of the circuit design, prompting analysis of waveform data generated during the simulation of the circuit design, or socially interacting with at least one of the different users of the design tool.

15. The apparatus of claim 9, wherein the design suggestions include at least one of a suggested part within a library in a display window, a different library in the display window, suggested parameters of a user selected part, a suggested circuit design developed by at least one of the different users of the design tool, a suggested circuit design simulation, a suggested analysis of a circuit design simulation, or a suggested report template.

16. The system of claim 8, wherein the design suggestions include at least one of a suggested part within a library in a display window, a different library in the display window, suggested parameters of a user selected part, a suggested circuit design developed by at least one of the different users of the design tool, a suggested circuit design, a suggested analysis of a circuit design simulation, or a suggested report template.

17. The system of claim 8, wherein the computing system, in response to execution of the computer-executable instructions, is further configured to:
   collect registration information associated with the user; and
   grant the user access to the design tool in response to registration information associated with the user.

18. The system of claim 17, wherein the computing system, in response to execution of the computer-executable instructions, is further configured to collect the registration information by:
   receiving login credentials corresponding to a social networking website from the user; and
   extracting social information from the social networking website in response to the login credentials, wherein the social information includes one or more of a social graph for the user, employment history of the user, or demographics of the user.

19. The system of claim 17, wherein the computing system, in response to execution of the computer-executable instructions, is further configured to: prompt presentation of collaborative suggestions on the display device available to the user based, at least in part, on the registration information from the user and the activity of the user on the design tool.

20. The system of claim 19, wherein the collaborative suggestions include a recommendation for the user to follow another user of the design tool or to follow design objects including at least one of a circuit design, a simulation of the circuit design, waveform data corresponding to the simulation, a waveform measurement, a model of the circuit design, a report, a forum corresponding to the circuit design.

* * * * *